US012713543B2

(12) United States Patent
Jang

(10) Patent No.: US 12,713,543 B2
(45) Date of Patent: Aug. 18, 2026

(54) DISPLAY DEVICE

(71) Applicant: Samsung Display Co., Ltd., Yongin-si (KR)

(72) Inventor: Minsok Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 400 days.

(21) Appl. No.: 18/347,140

(22) Filed: Jul. 5, 2023

(65) Prior Publication Data

US 2024/0138080 A1 Apr. 25, 2024
US 2024/0237239 A9 Jul. 11, 2024

(30) Foreign Application Priority Data

Oct. 19, 2022 (KR) ........................ 10-2022-0135152

(51) Int. Cl.
*H05K 5/02* (2006.01)
*G06F 1/16* (2006.01)

(52) U.S. Cl.
CPC ......... *H05K 5/0217* (2013.01); *G06F 1/1652* (2013.01); *G06F 1/1616* (2013.01)

(58) Field of Classification Search
CPC ... H05K 5/0217; G06F 1/1652; G06F 1/1618; G06F 1/1616; G06F 1/1681; G09F 9/301
See application file for complete search history.

(56) References Cited

U.S. PATENT DOCUMENTS

2018/0192527 A1* 7/2018 Yun ........................ G06F 1/1681
2019/0334114 A1* 10/2019 Park ................... H10K 50/8426
2020/0389986 A1* 12/2020 Tsuchihashi .......... G06F 1/1626
2021/0191459 A1* 6/2021 Kim ........................ H10K 59/87
2021/0378109 A1* 12/2021 Kim .......................... B32B 3/18
2021/0397218 A1* 12/2021 Seo ........................ G06F 1/1616
2021/0408412 A1* 12/2021 Park ...................... B32B 27/306
2022/0229469 A1* 7/2022 Cho ...................... G06F 1/1641

FOREIGN PATENT DOCUMENTS

KR 10-2210047 2/2021
KR 10-2021-0068722 6/2021
KR 10-2021-0087605 7/2021
KR 10-2022-0001528 1/2022
KR 10-2022-0087193 6/2022

* cited by examiner

*Primary Examiner* — Sagar Shrestha
(74) *Attorney, Agent, or Firm* — Sughrue Mion, PLLC

(57) ABSTRACT

A display device includes a display panel including a first non-folding area, a second non-folding area spaced apart from the first non-folding area, and a folding area disposed between the first non-folding area and the second non-folding area, a first support member disposed below the display panel in the first non-folding area and having a hemming structure at an end adjacent to the folding area, a second support member disposed below the display panel in the second non-folding area, having a hemming structure at an end adjacent to the folding area, and spaced apart from the first support member in the folding area, and a metal member disposed between the first support member and the second support member and including a metal and a plurality of pores.

8 Claims, 17 Drawing Sheets

10
NFA1
FDA
NFA2
I
I'
NDA
DA
DR1
DR2
DR3

FIG. 4

PL
NFA2
FDA
NFA1
410
PR
420
300
200
I
I'

PL
300
350 340 330
NFA2
FDA
NFA1
410
PR
420
PR
250 240 230
200
I
I'

FIG. 7

PL
300
350 340 330
NFA2
FDA
410
PR
420
NFA1
FL
FL
250 240 230
200

FIG. 13

PL
III'
NFA2
FDA
NFA1
PR
III
620
630
610

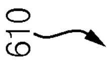
610
FIG. 14
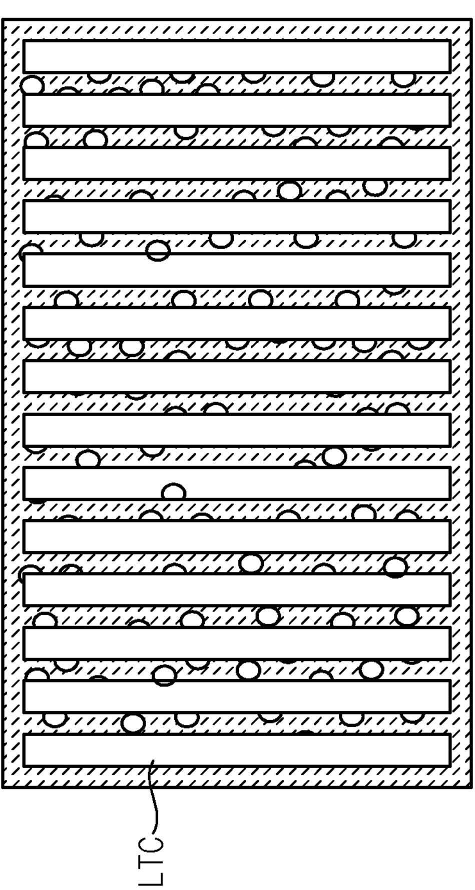
LTC

FIG. 15

PL
III'
NFA2
FDA
PT1
NFA1
PT2
PR
III
620
630
610

FIG. 16

PL
III'
NFA2
FDA
NFA1
PR
III
620
630
610
630
640

PL
III'
NFA2
FDA
NFA1
PR
PT1
PT2
620
630
610
630
640
III

DISPLAY DEVICE

CROSS-REFERENCE TO RELATED APPLICATION(S)

This application claims priority to and benefits of Korean Patent Application No. 10-2022-0135152 under 35 USC § 119, filed on Oct. 19, 2022, in the Korean Intellectual Property Office (KIPO), the entire contents of which are incorporated herein by reference.

BACKGROUND

1. Technical Field

Embodiments relate to a foldable display device that displays an image.

2. Description of the Related Art

Recently, a flexible display device capable of being changed into various shapes has been developed. Unlike a flat panel display, the flexible display device may be folded, bent or rolled like paper. The flexible display device may be readily carriable and may improve user convenience.

Recently, among the flexible display devices, a foldable display device is in the spotlight. The foldable display device may be repeatedly folded and unfolded. The foldable display device may include a flexible display panel and a support member disposed below the display panel. The support member may have relatively high rigidity, and thus may prevent deformation of the display panel due to a user's touch and the like.

SUMMARY

Embodiments provide a display device with improved reliability,

According to an embodiment, a display device may include a display panel including a first non-folding area, a second non-folding area spaced apart from the first non-folding area, and a folding area disposed between the first non-folding area and the second non-folding area, a first support member disposed below the display panel in the first non-folding area and having a hemming structure at an end adjacent to the folding area, a second support member disposed below the display panel in the second non-folding area, having a hemming structure at an end adjacent to the folding area, and spaced apart from the first support member in the folding area, and a metal member disposed between the first support member and the second support member and including a metal and a plurality of pores.

In an embodiment, the display device may further include an adhesive member disposed below the metal member. The adhesive member may contact the first support member and the second support member.

In an embodiment, each of the first support member and the second support member may include a first metal layer and a second metal layer disposed on the first metal layer.

In an embodiment, the first metal layer and the metal member may include a same material.

In an embodiment, each of the first support member and the second support member may further include a third metal layer disposed on the second metal layer, and the second metal layer and the metal member may include a same material.

In an embodiment, the display device may further include a filling member filling the plurality of pores included in the second metal layer.

In an embodiment, the filling member may coat an upper surface of the second metal layer.

In an embodiment, the metal member may include aluminum.

According to an embodiment, a display device may include a display panel including a folding area and a non-folding area adjacent to the folding area, and a protective layer disposed below the display panel. The protective layer may include a first metal layer, a second metal layer disposed on the first metal layer and including a metal and a plurality of pores, and a third metal layer disposed on the second metal layer.

In an embodiment, the protective layer may further include a plurality of first patterns penetrating the protective layer in the folding area.

In an embodiment, the protective layer may further include a plurality of second patterns adjacent to the first patterns and recessed toward an upper surface of the protective layer adjacent to the display panel from a lower surface of the protective layer spaced apart from the display panel in the non-folding area.

In an embodiment, the second metal layer may have a lattice structure.

In an embodiment, the protective layer may further include adhesive members. The adhesive members may be disposed between the first metal layer and the second metal layer and between the second metal layer and the third metal layer, respectively.

In an embodiment, the second metal layer may include aluminum.

According to an embodiment, a display device may include a display panel including a folding area and a non-folding area adjacent to the folding area, and a protective layer disposed below the display panel. The protective layer may include a protective member including a plurality of pores, an adhesive member disposed on the protective member, and a first metal layer disposed on the adhesive member.

In an embodiment, the protective member may include a polymer.

In an embodiment, the protective layer may further include a plurality of first patterns penetrating the protective layer in the folding area.

In an embodiment, the protective layer may further include a plurality of second patterns adjacent to the first patterns and recessed toward an upper surface of the protective layer adjacent to the display panel from a lower surface of the protective layer spaced apart from the display panel in the non-folding area.

In an embodiment, the protective member may have a lattice structure.

In an embodiment, the protective layer may further include a second metal layer disposed below the protective member. The adhesive member may be further disposed between the second metal layer and the protective member.

In a display device according to embodiments of the disclosure, the display device may include a protective layer including a first support member, a second support member, a metal member, and an adhesive member that couples each of the first and second support members to the metal member. As an end adjacent to a folding area of each of the first and second support members has a hemming structure, a weight of the display device may be reduced, and impact resistance and deformation rate of the display device may be improved.

Since the metal member includes a metal (e.g., aluminum) and a plurality of pores, an etching process for forming openings penetrating the protective layer may not be required.

Accordingly, materials that may be used as the protective layer may be diversified, and productivity of the display device may be improved.

Since the protective layer includes a metal (e.g., aluminum) or a polymer and a plurality of pores, an impact force applied to a display panel may be reduced. Accordingly, a display quality of the display device may be improved by improving bright spot defects.

BRIEF DESCRIPTION OF THE DRAWINGS

FIG. 4 is a schematic cross-sectional view taken along line I-I' of FIG. 1 according to an embodiment.

FIG. 5 is a schematic cross-sectional view taken along line I-I' of FIG. 1 according to an embodiment.

FIG. 6 is a schematic cross-sectional view taken along line I-I' of FIG. 1 according to an embodiment.

FIG. 7 is a schematic cross-sectional view taken along line I-I' of FIG. 1 according to an embodiment.

FIG. 13 is a schematic cross-sectional view taken along line III-III' of FIG. 12 according to an embodiment.

FIG. 14 is a plan view illustrating a protective member of FIG. 13.

FIG. 15 is a schematic cross-sectional view taken along line III-III' of FIG. 12 according to an embodiment.

FIG. 16 is a schematic cross-sectional view taken along line III-III' of FIG. 12 according to an embodiment.

DETAILED DESCRIPTION OF THE EMBODIMENTS

Figure 1:
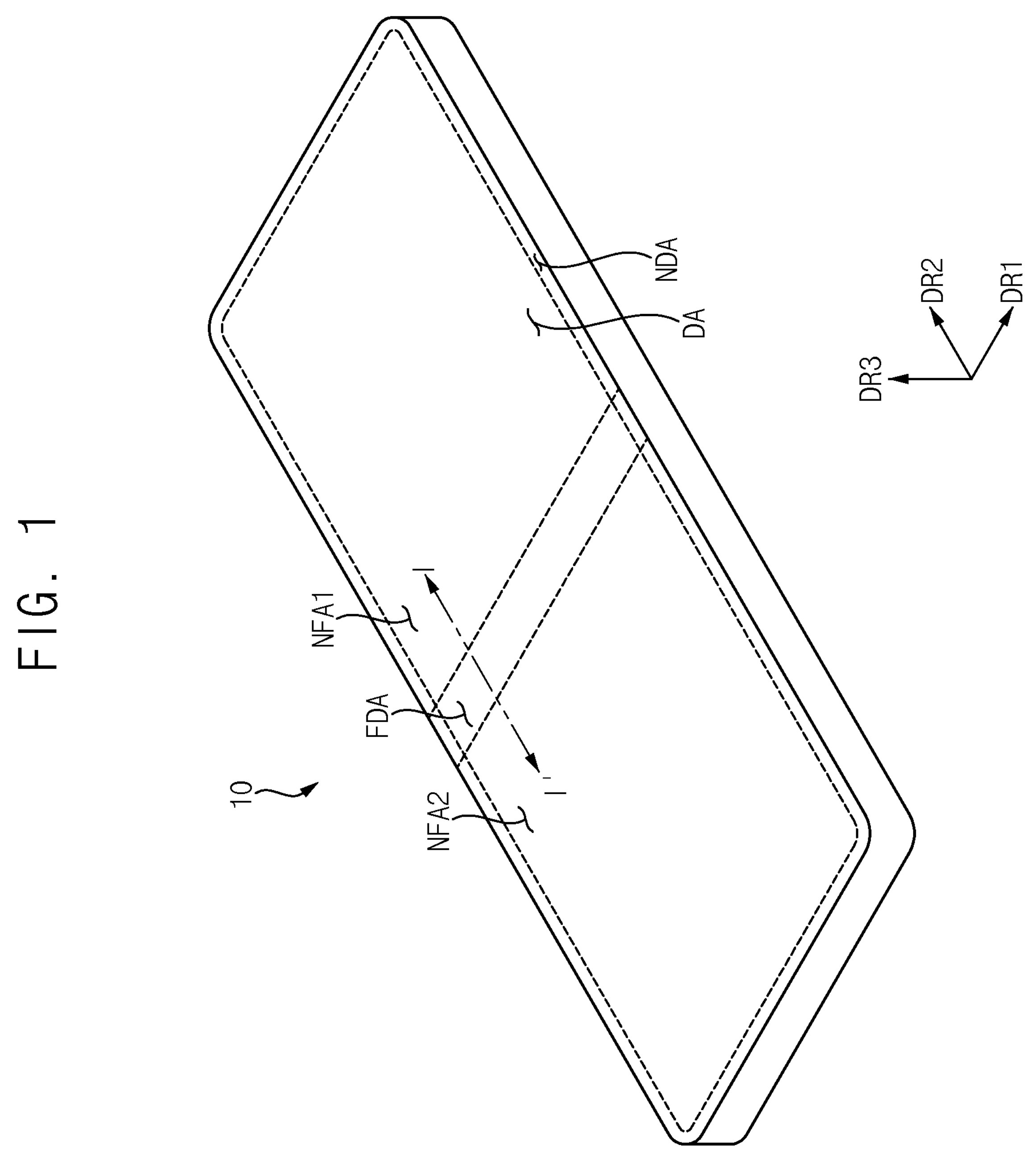
FIGS. 1 and 2 are perspective views illustrating a display device according to an embodiment of the disclosure.

Hereinafter, embodiments of the disclosure will be described in more detail with reference to the accompanying drawings. The same reference numerals are used for the same components in the drawings, and redundant descriptions of the same components will be omitted.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
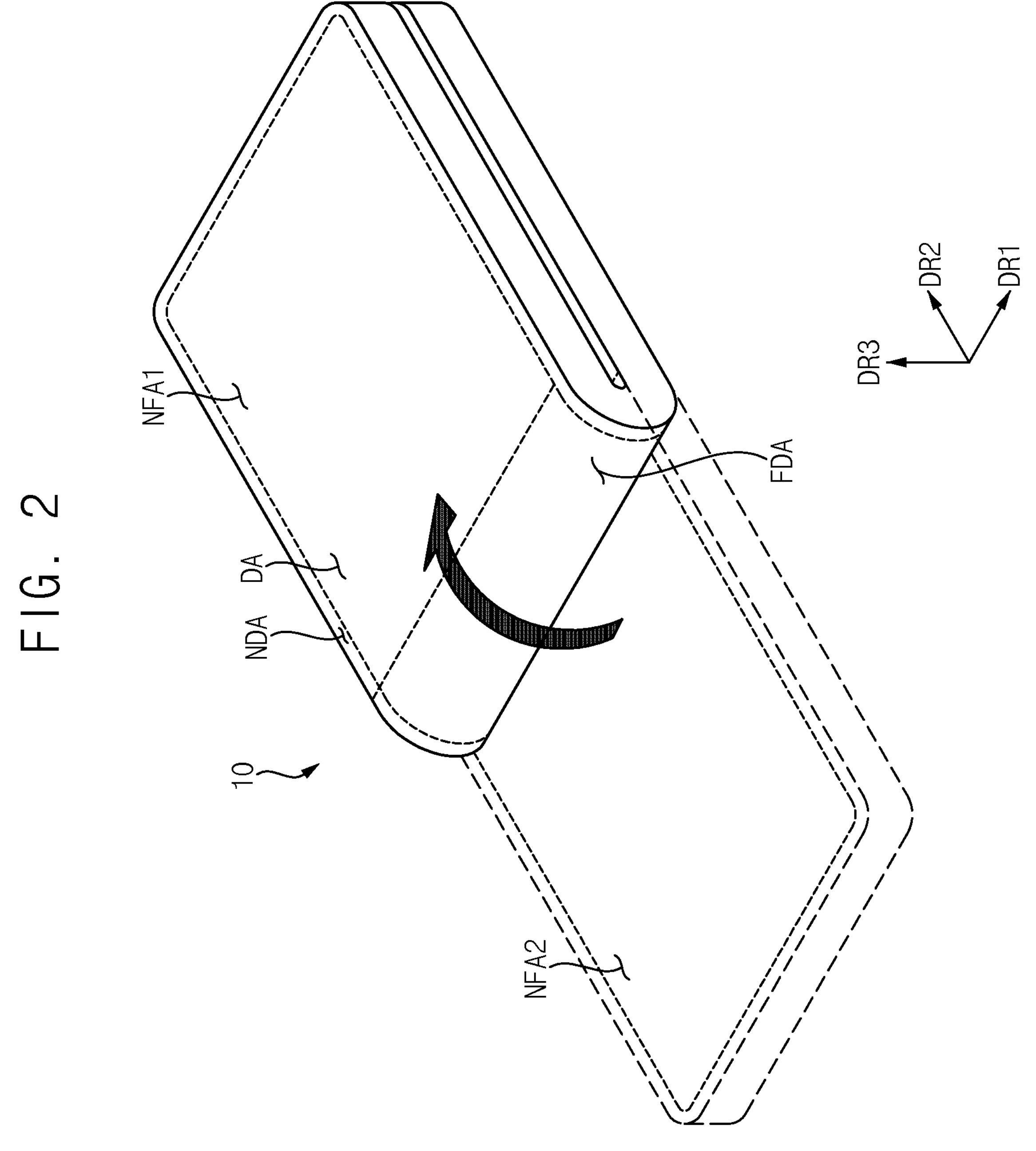

FIGS. 1 and 2 are perspective views illustrating a display device according to an embodiment of the disclosure. For example, FIG. 1 is a perspective view illustrating a state in which a display device 10 is unfolded according to an embodiment, and FIG. 2 is a perspective view illustrating a state in which the display device 10 is folded according to an embodiment.

Referring to FIGS. 1 and 2, the display device 10 may include a display area DA and a non-display area NDA.

The display area DA may be an area capable of displaying an image by generating light. Multiple pixels that emit light may be disposed in the display area DA, and thus the image may be displayed in the display area DA. The pixels may be arranged in a matrix form along a first direction DR1 and a second direction DR2 intersecting the first direction DR1. For example, the second direction DR2 may be perpendicular to the first direction DR1. In the display area DA, the image may be displayed in a third direction DR3 intersecting each of the first direction DR1 and the second direction DR2.

The non-display area NDA may be an area not displaying an image. The non-display area NDA may be disposed adjacent to the display area DA. For example, the non-display area NDA may surround at least a portion of the display area DA. For example, the non-display area NDA may entirely surround the display area DA.

The display device 10 may be a foldable display device. The display device 10 may include a first non-folding area NFA1, a second non-folding area NFA2 and a folding area FDA depending on whether the area is foldable. In an embodiment, the first non-folding area NFA1 and the second non-folding area NFA2 may be spaced apart from each other, and the folding area FDA may be positioned between the first non-folding area NFA1 and the second non-folding area NFA2.

The folding area FDA may be an area in which the display device 10 is folded, and each of the first non-folding area NFA1 and the second non-folding area NFA2 may be an area in which the display device 10 is not folded. The display device 10 may be folded with respect to the folding area FDA so that the first non-folding area NFA1 and the second non-folding area NFA2 face each other. The folding area FDA may be folded to have a curvature.

Although FIGS. 1 and 2 illustrate that the display device 10 includes one folding area FDA and is folded once, the disclosure is not limited thereto. For example, the display device 10 may include two or more folding areas and be folded two or more times.

Although FIGS. 1 and 2 illustrate that the folding area FDA extends in the first direction DR1 and the display device 10 is folded in the second direction DR2, the disclosure is not limited thereto. For example, the folding area FDA may extend in the second direction DR2 and the display device 10 may be folded in the first direction DR1.

Figure 3:
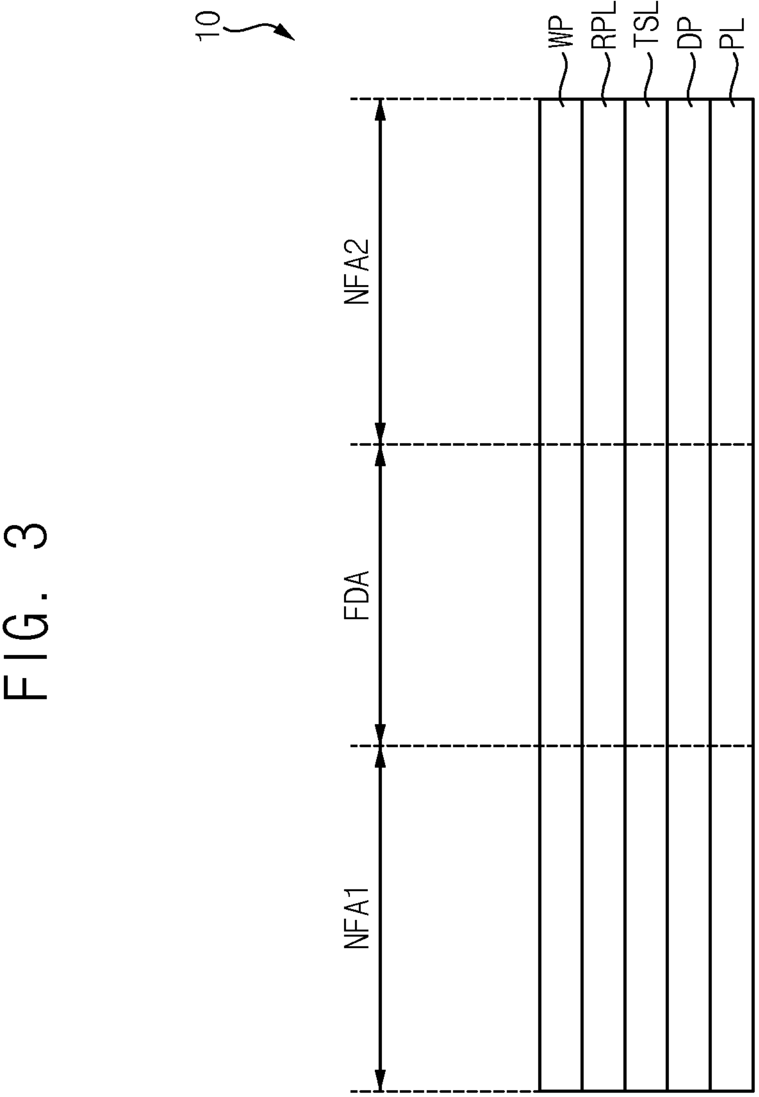
FIG. 3 is a schematic cross-sectional view illustrating the display device of FIG. 1.

FIG. 3 is a schematic cross-sectional view illustrating the display device of FIG. 1.

Referring to FIG. 3, the display device 10 may include a protective layer PL, a display panel DP, a touch sensing layer TSL, an anti-reflection layer RPL and a window member WP. In an embodiment, the anti-reflection layer RPL may not be an essential configuration. For example, the anti-reflection layer RPL may be replaced with another element or may be omitted.

The protective layer PL may protect the display device 10 from an impact applied from a lower side of the display device 10. In an embodiment, the protective layer PL may include a material having rigidity. In an embodiment, the protective layer PL may reflect light incident on the lower side of the display device 10. For example, the protective layer PL may include a metal. In an embodiment, the metal may not be disposed in at least a portion of the folding area FDA. For example, the metal may be disposed in only a portion of the folding area FDA, or may not be disposed in the folding area FDA. In another embodiment, the metal may be disposed in an entire area of the folding area FDA and the first and second non-folding areas NFA1 and NFA2.

The display panel DP may be disposed on the protective layer PL. The display panel DP may display an image from the pixels. For example, the display panel DP may display an image by emitting light to an upper surface of the display panel DP.

The touch sensing layer TSL may be disposed on the display panel DP. The touch sensing layer TSL may recognize an external input (e.g., a touch). In an embodiment, the touch sensing layer TSL may be provided as a separate panel or film on the display panel DP, and may be attached to the display panel DP. In another embodiment, the touch sensing layer TSL and the display panel DP may be integral with each other.

The anti-reflection layer RPL may be disposed on the touch sensing layer TSL. The anti-reflection layer RPL may reduce reflectance of external light incident on an upper side of the window member WP.

The window member WP may be disposed on the anti-reflection layer RPL. The window member WP may block foreign matter penetrating from an outside, and may prevent an impact applied from the outside from being transmitted to configurations disposed below the window member WP.

Figure 4:
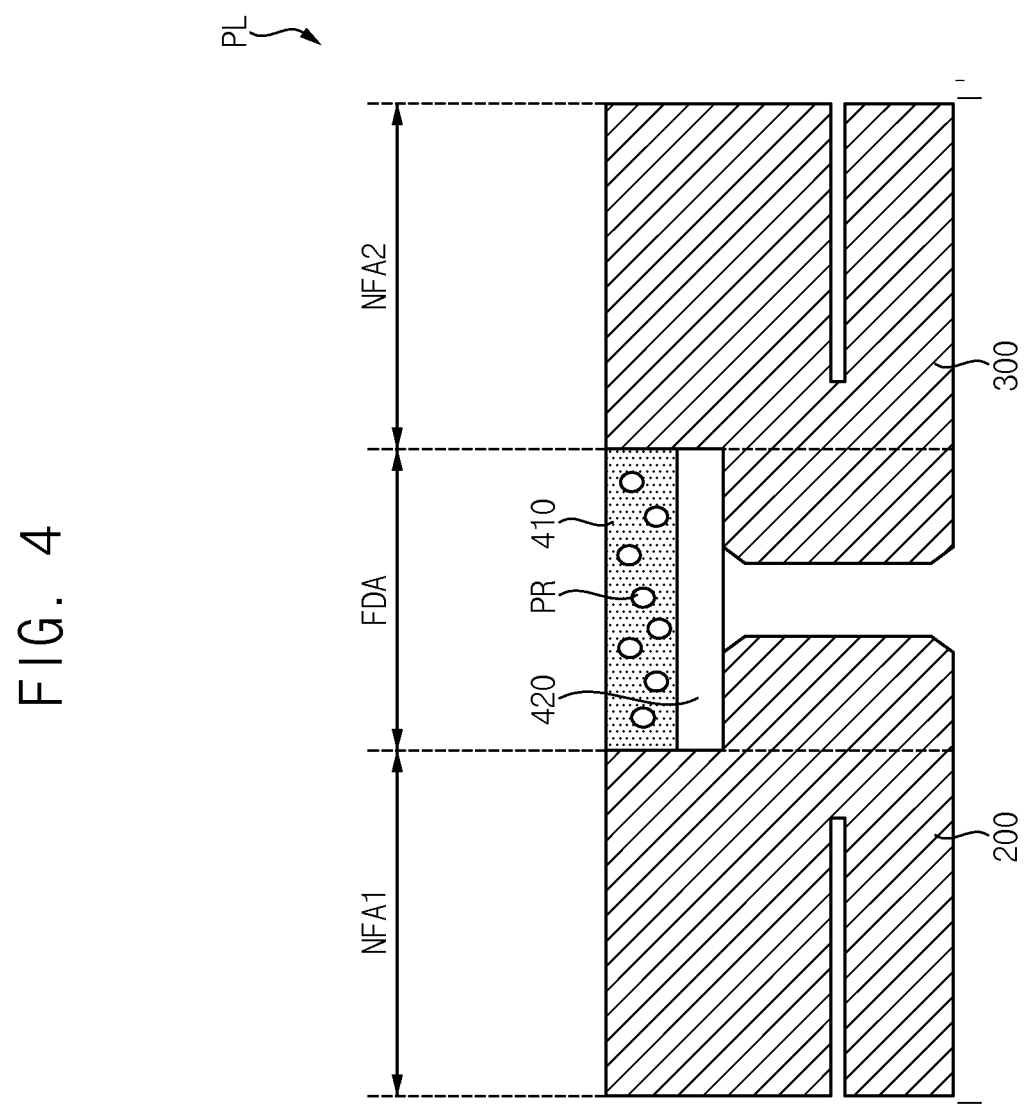

FIG. 4 is a schematic cross-sectional view taken along line I-I' of FIG. 1 according to an embodiment. For example, FIG. 4 is a schematic cross-sectional view illustrating the folding area FDA, the first non-folding area NFA1 and the second non-folding area NFA2 of the protective layer PL included in the display device 10 of FIG. 1 according to an embodiment.

Referring to FIG. 4, according to an embodiment, the protective layer PL may include a first support member 200, a second support member 300, a metal member 410 and an adhesive member 420.

The first support member 200 may overlap the first non-folding area NFA1, and the second support member 300 may overlap the second non-folding area NFA2 in the thickness direction. The first support member 200 and the second support member 300 may be spaced apart from each other in the folding area FDA.

In an embodiment, each of the first support member 200 and the second support member 300 may have a structure in which an end adjacent to the folding area FDA is folded. In other words, the end adjacent to the folding area FDA of each of the first support member 200 and the second support member 300 may have a hemming structure.

The first support member 200 and the second support member 300 may include a metal. For example, the first support member 200 and the second support member 300 may include stainless steel.

The metal member 410 may be disposed between the first support member 200 and the second support member 300. In an embodiment, the metal member 410 may include a metal and multiple pores PR. For example, the metal member 410 may include aluminum (Al) and the pores PR. However, the disclosure is not limited thereto.

The adhesive member 420 may be disposed between the metal member 410 and the first and second support members 200 and 300. In an embodiment, the adhesive member 420 may be a pressure sensitive adhesive (PSA). The adhesive member 420 may contact the first support member 200 and the second support member 300, and may couple the metal member 410 to each of the first support member 200 and the second support member 300.

Figure 5:
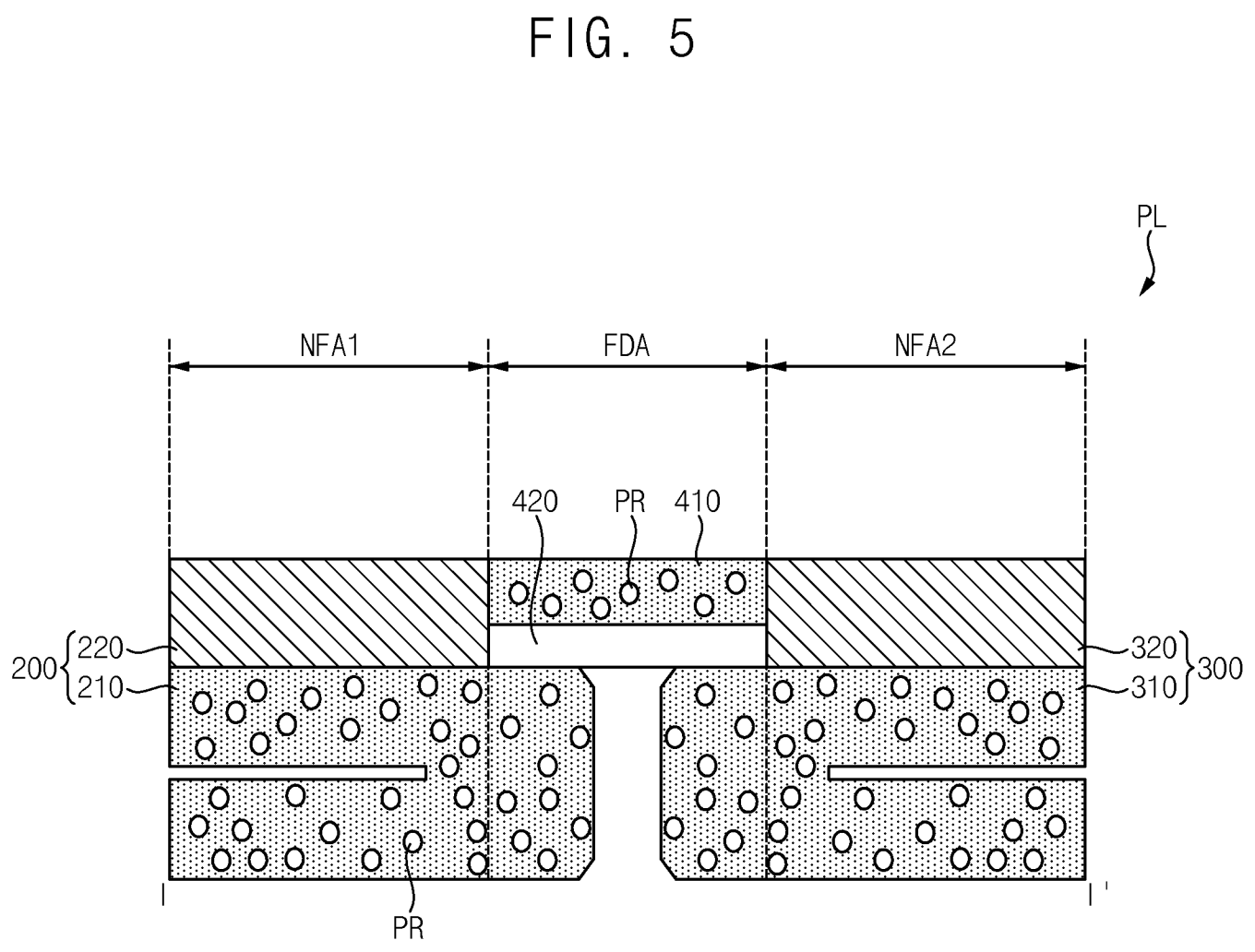

FIG. 5 is a schematic cross-sectional view taken along line I-I' of FIG. 1 according to an embodiment.

Referring to FIG. 5, the protective layer PL may include the first support member 200, the second support member 300, the metal member 410 and the adhesive member 420. Hereinafter, descriptions overlapping with those of the protective layer PL described with reference to FIG. 4 will be omitted or simplified.

The first support member 200 may include a first metal layer 210 and a second metal layer 220 disposed on the first metal layer 210. The second support member 300 may include a first metal layer 310 and a second metal layer 320 disposed on the first metal layer 310.

Each of the first metal layers 210 and 310 and the second metal layers 220 and 320 may include different materials. In an embodiment, each of the first metal layers 210 and 310 and the metal member 410 may include a same material. In an embodiment, each of the first metal layers 210 and 310 may include a metal and the pores PR. For example, each of the first metal layers 210 and 310 may include aluminum and the pores PR, and each of the second metal layers 220 and 320 may include stainless steel. However, the disclosure is not limited thereto.

Figure 6:
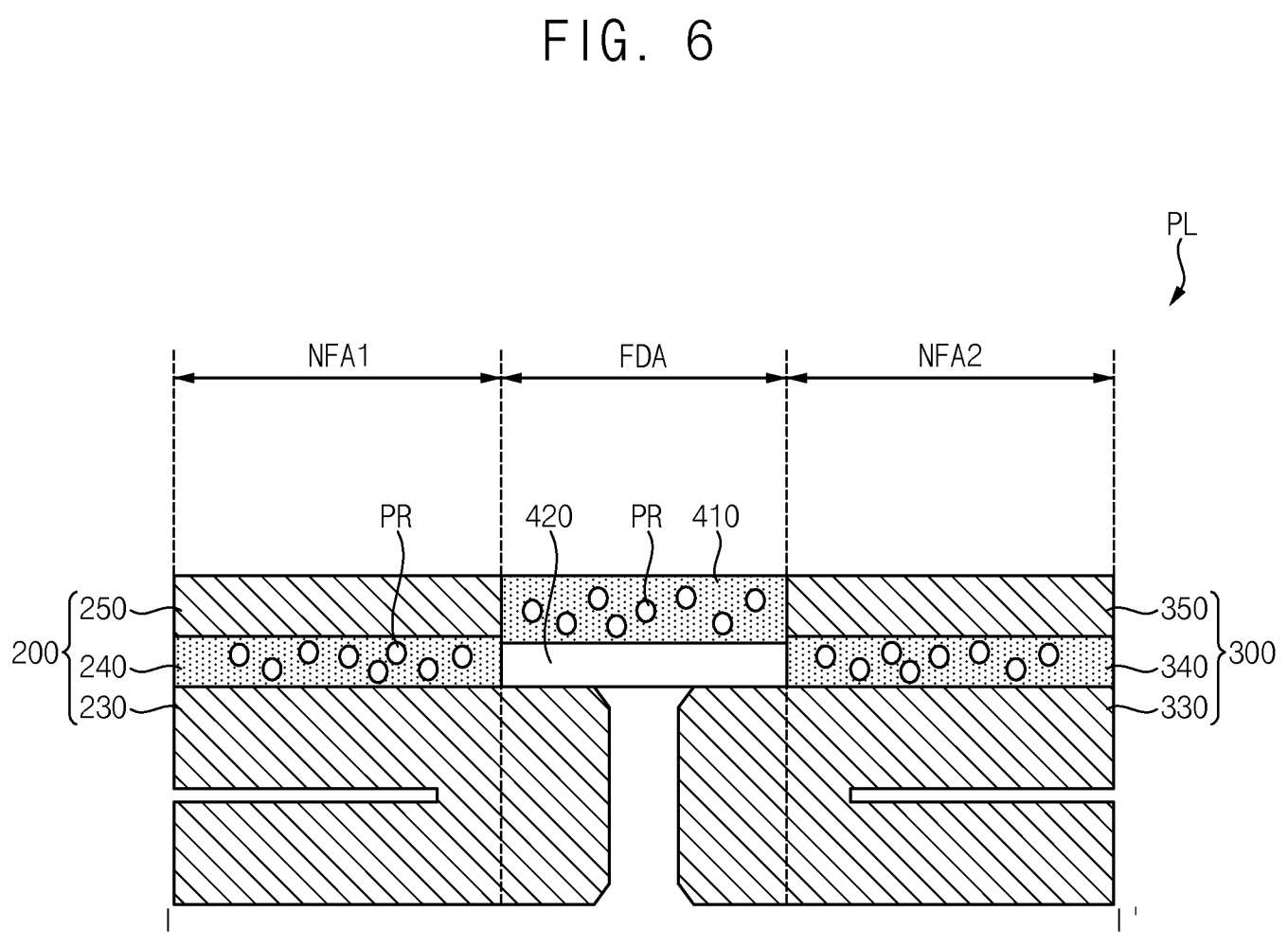

FIG. 6 is a schematic cross-sectional view taken along line I-I' of FIG. 1 according to an embodiment.

Referring to FIG. 6, the protective layer PL may include the first support member 200, the second support member 300, the metal member 410 and the adhesive member 420. Hereinafter, descriptions overlapping with those of the protective layer PL described with reference to FIG. 4 will be omitted or simplified.

The first support member 200 may include a first metal layer 230, a second metal layer 240 disposed on the first metal layer 230, and a third metal layer 250 disposed on the second metal layer 240. The second support member 300 may include a first metal layer 330, a second metal layer 340 disposed on the first metal layer 330, and a third metal layer 350 disposed on the second metal layer 340.

The first metal layers 230 and 330 and the third metal layers 250 and 350 may include a same material, and each of the second metal layers 240 and 340 may include a material different from the material included in the first metal layers 230 and 330 and the third metal layers 250 and 350.

In an embodiment, each of the second metal layers 240 and 340 and the metal member 410 may include a same material. In an embodiment, each of the second metal layers 240 and 340 may include a metal and the pores PR. For example, each of the second metal layers 240 and 340 may include aluminum and the pores PR, and each of the first metal layers 230 and 330 and the third metal layers 250 and 350 may include stainless steel. However, the disclosure is not limited thereto.

Figure 7:
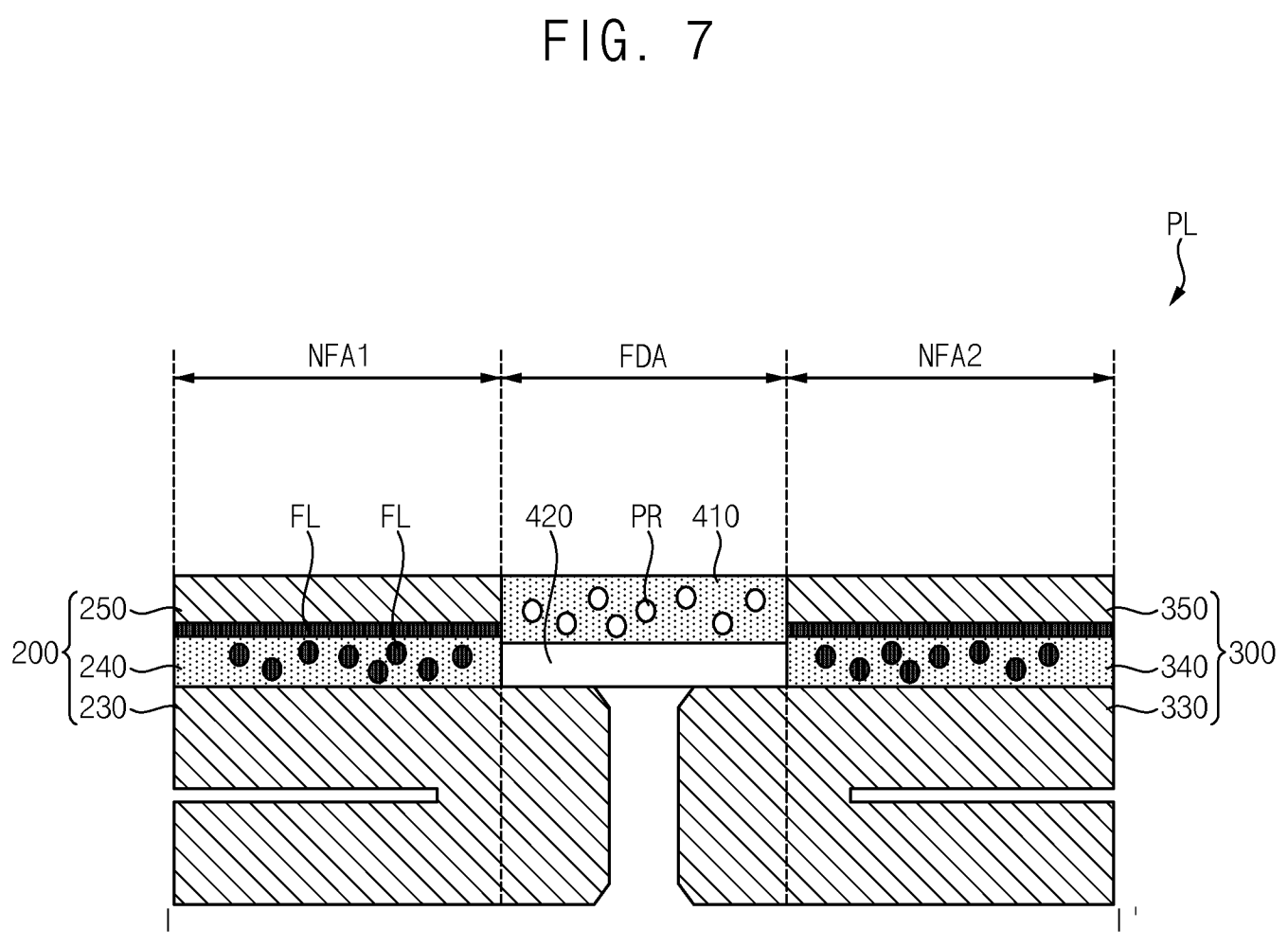

FIG. 7 is a schematic cross-sectional view taken along line I-I' of FIG. 1 according to an embodiment.

Referring to FIG. 7, the protective layer PL may include the first support member 200, the second support member 300, the metal member 410 and the adhesive member 420.

Hereinafter, descriptions overlapping with those of the protective layer PL described with reference to FIGS. 4 and 6 will be omitted or simplified.

Each of the second metal layers 240 and 340 may include a metal and the pores PR. In an embodiment, a filling member FL may fill the pores PR included in each of the second metal layers 240 and 340. In an embodiment, the filling member FL may coat upper surfaces of the second metal layers 240 and 340 adjacent to each of the third metal layers 250 and 350.

The display device 10 according to an embodiment of the disclosure may include the first and second support members 200 and 300, the metal member 410 and the adhesive member 420 that couples the metal member 410 to each of the first and second support members 200 and 300. As the end adjacent to the folding area FDA of each of the first and second support members 200 and 300 has the hemming structure, a weight of the display device 10 may decrease, and impact resistance and deformation rate of the display device 10 may be improved. Since the metal member 410 includes a metal (e.g., aluminum) and the pores PR, an etching process for forming openings penetrating the protective layer PL may not be required. Accordingly, materials that may be used as the protective layer PL may be diversified, and productivity of the display device 10 may be increased.

Figure 8:
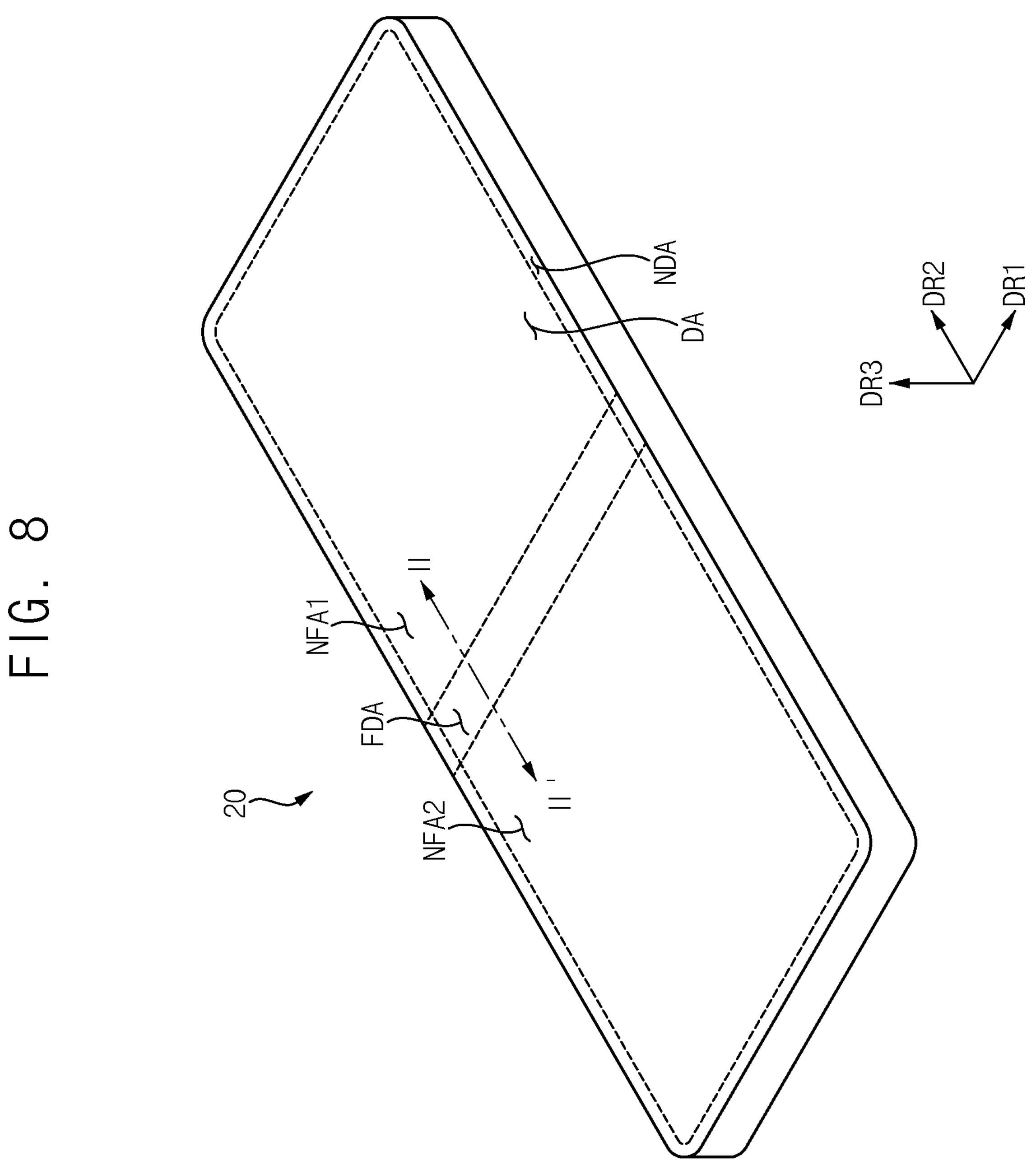
FIG. 8 is a perspective view illustrating a display device according to an embodiment of the disclosure.
Figure 9:
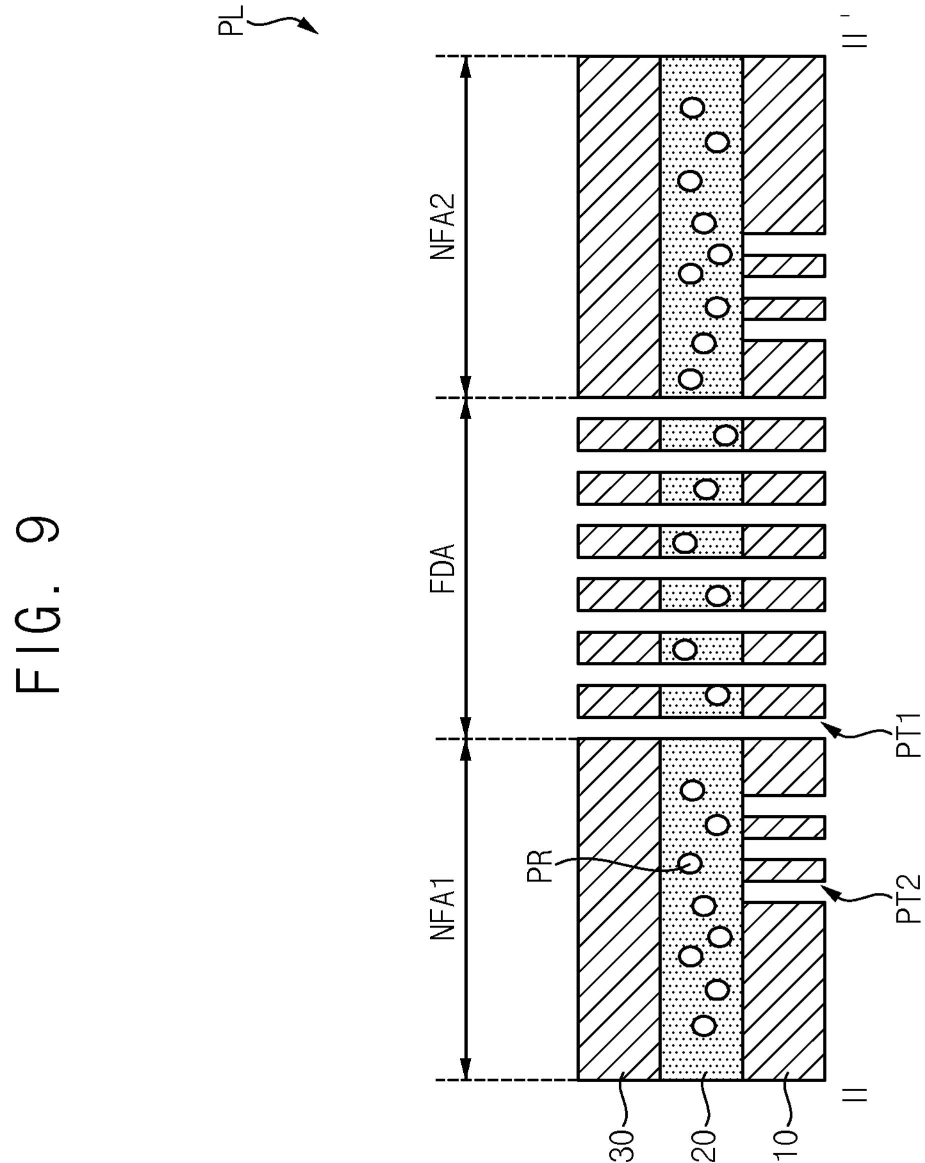
FIG. 9 is a schematic cross-sectional view taken along line II-II' of FIG. 8 according to an embodiment.
Figure 10:
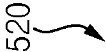
FIG. 10 is a plan view illustrating a second metal layer of FIG. 9.
Figure 10:
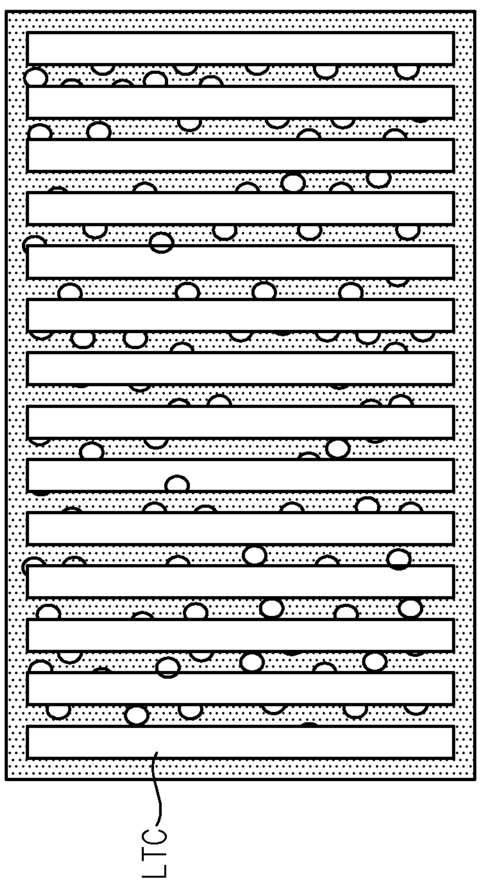

FIG. 8 is a perspective view illustrating a display device according to an embodiment of the disclosure. FIG. 9 is a schematic cross-sectional view taken along line II-II' of FIG. 8 according to an embodiment. FIG. 10 is a plan view illustrating a second metal layer of FIG. 9.

For example, FIG. 9 is a schematic cross-sectional view illustrating a folding area FDA, a first non-folding area NFA1 and a second non-folding area NFA2 of a protective layer PL included in a display device 20 of FIG. 8 according to an embodiment, and FIG. 10 is a plan view illustrating a second metal layer 520 included in the protective layer PL of FIG. 9 according to an embodiment.

Hereinafter, descriptions overlapping those of the display device 10 described with reference to FIGS. 1 and 2 will be omitted or simplified.

Referring to FIGS. 8, 9 and 10, the protective layer PL included in the display device 20 may include a first metal layer 510, the second metal layer 520 and a third metal layer 530. The first metal layer 510, the second metal layer 520 and the third metal layer 530 may be disposed in an entire area of the folding area FDA, the first non-folding area NFA1 and the second non-folding area NFA2.

The first metal layer 510 may include a metal. For example, the first metal layer 510 may include stainless steel.

The second metal layer 520 may be disposed on the first metal layer 510. In an embodiment, the second metal layer 520 may include a metal and multiple pores PR. For example, the second metal layer 520 may include aluminum and the pores PR. However, the disclosure is not limited thereto.

In an embodiment, the second metal layer 520 may have a lattice structure LTC. The lattice structure LTC of the second metal layer 520 may be formed through a photolithography process.

Although FIG. 10 illustrates that the second metal layer 520 has the lattice structure LTC defining repeated openings of rectangular planar shape in a plan view, the disclosure is not limited thereto. In another embodiment, the second metal layer 520 may have the lattice structure LTC defining repeated openings of various shapes, may have the lattice structure LTC defining repeated recesses of various shapes, or may not have the lattice structure LTC.

The third metal layer 530 may be disposed on the second metal layer 520. The third metal layer 530 and the first metal layer 510 may include a same material. For example, the third metal layer 530 may include stainless steel.

In an embodiment, the protective layer PL may include multiple first patterns PT1 overlapping the folding area FDA and penetrating the protective layer PL in the thickness direction.

The protective layer PL may include multiple second patterns PT2 overlapping the first and second non-folding areas NFA1 and NFA2 adjacent to the first patterns PT1 in the thickness direction. In an embodiment, the second patterns PT2 may be patterns recessed from a lower surface of the protective layer PL spaced apart from a display panel (e.g., the display panel DP of FIG. 3) toward an upper surface of the protective layer PL adjacent to the display panel. For example, the second patterns PT2 may be recessed patterns from a lower surface of the first metal layer 510 toward the third metal layer 530.

Figure 11:
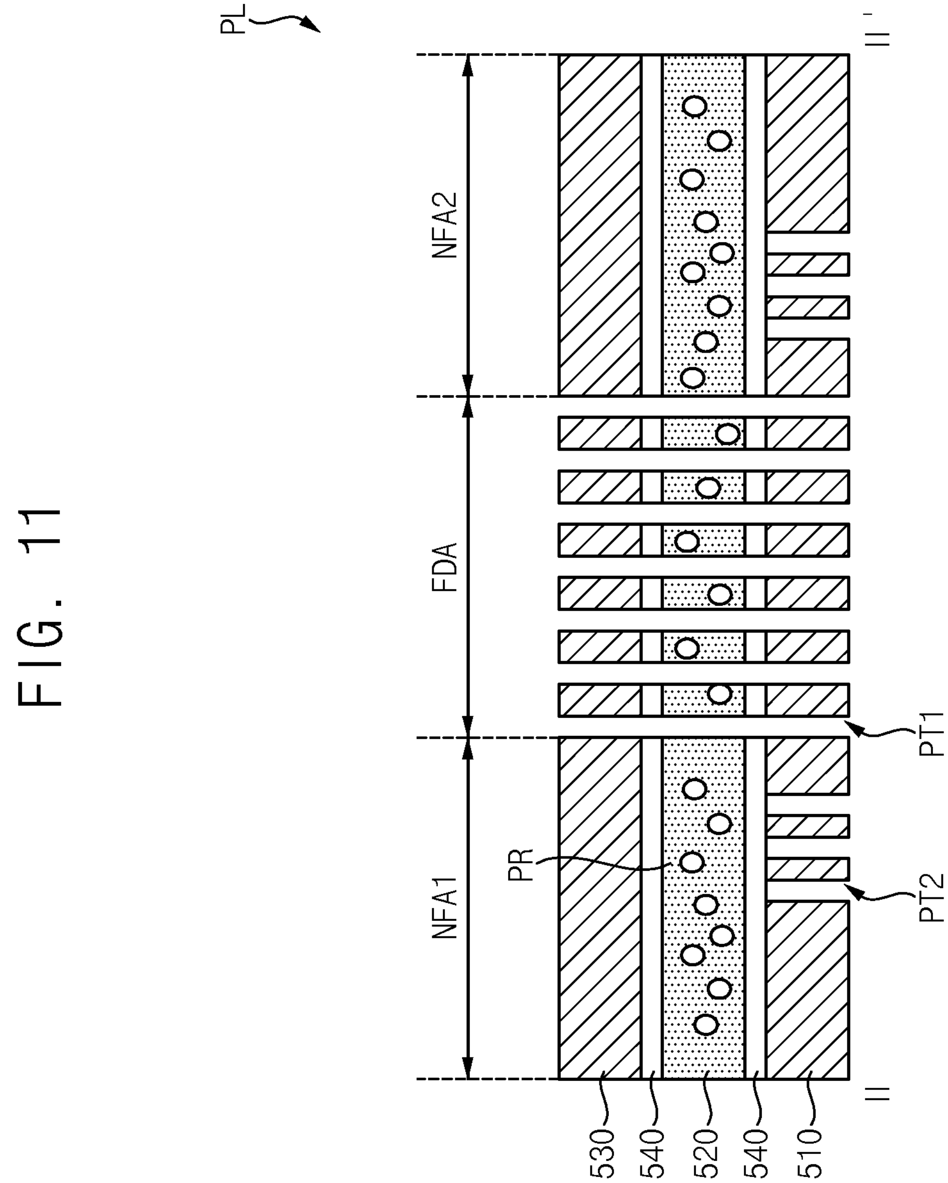
FIG. 11 is a schematic cross-sectional view taken along line II-II' of FIG. 8 according to an embodiment.

FIG. 11 is a schematic cross-sectional view taken along line II-II' of FIG. 8 according to an embodiment.

Referring to FIG. 11, the protective layer PL may include the first metal layer 510, the second metal layer 520, the third metal layer 530 and adhesive members 540.

Hereinafter, descriptions overlapping with those of the protective layer PL described with reference to FIGS. 9 and 10 will be omitted or simplified.

The second metal layer 520 and the third metal layer 530 may be sequentially disposed on the first metal layer 510.

Each of the adhesive members 540 may be disposed between the first metal layer 510 and the second metal layer 520 and between the second metal layer 520 and the third metal layer 530. Each of the adhesive members 540 may couple the first metal layer 510 and the second metal layer 520, and may couple the second metal layer 520 and the third metal layer 530. In an embodiment, the adhesive member 540 may be a pressure sensitive adhesive (PSA).

The display device 20 according to an embodiment of the disclosure may include the protective layer PL including the first metal layer 510, the second metal layer 520 and the third metal layer 530. As the second metal layer 520 includes a metal (e.g., aluminum) and the pores PR, impact force applied to the display panel may be reduced. Accordingly, bright spot defects caused by a material having high rigidity of the display panel may be improved. Since the protective layer PL includes the first patterns PT1 overlapping the folding area FDA and penetrating the protective layer PL and the second patterns PT2 overlapping the first and second non-folding areas NFA1 and NFA2 and recessed from the lower surface of the protective layer PL in the thickness direction, impact resistance and strain rate of the display device 20 may be improved.

Figure 12:
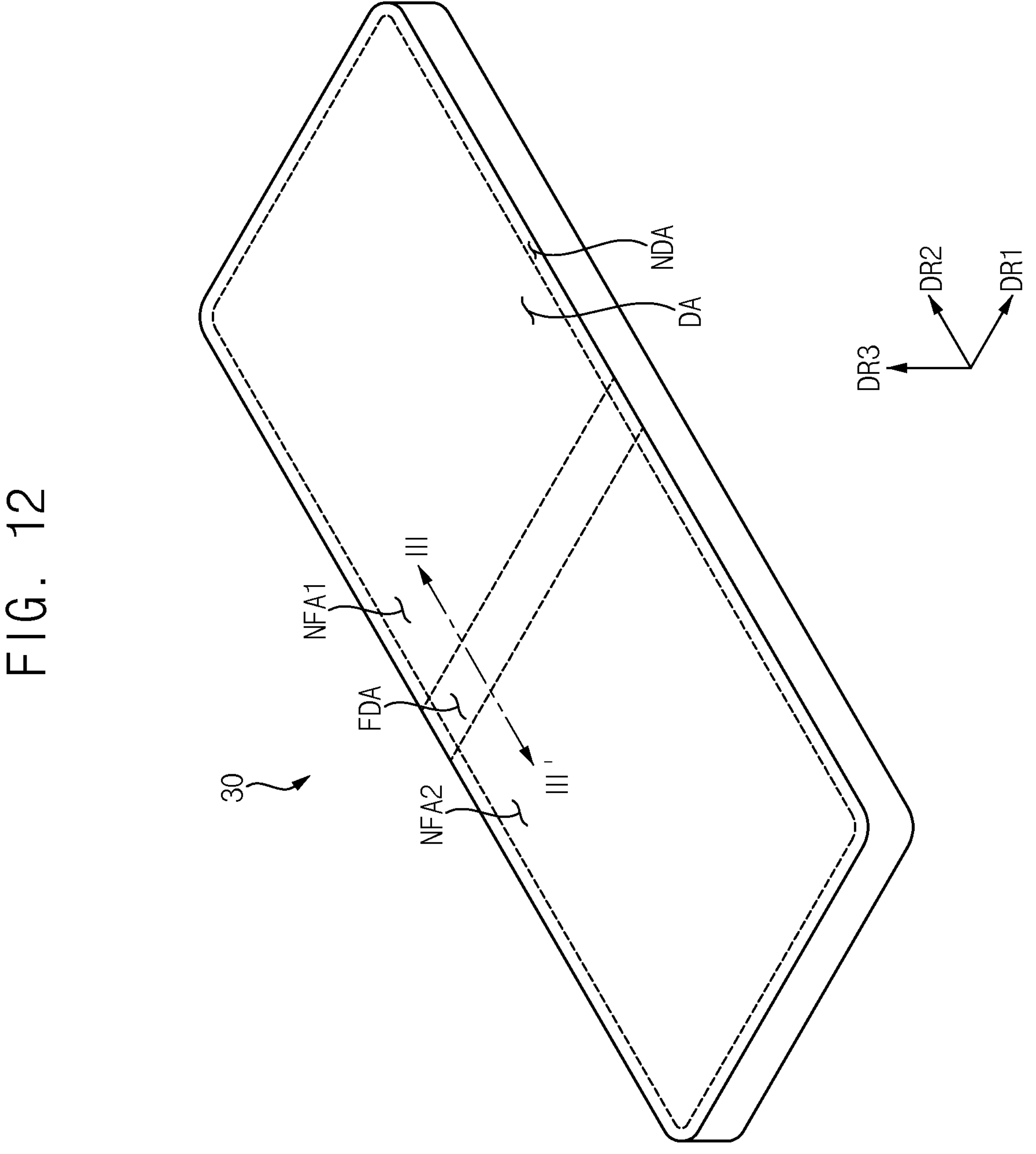
FIG. 12 is a perspective view illustrating a display device according to an embodiment of the disclosure.
Figure 13:
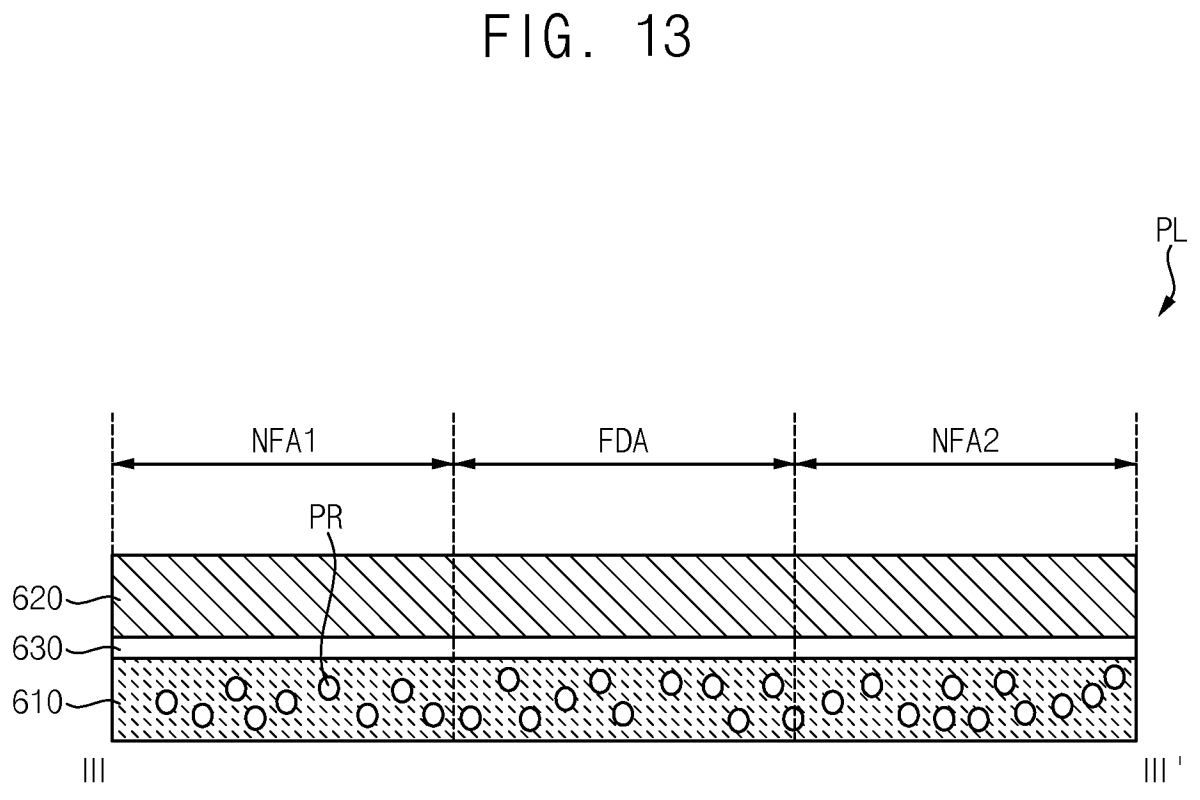

FIG. 12 is a perspective view illustrating a display device according to an embodiment of the disclosure. FIG. 13 is a schematic cross-sectional view taken along line III-III' of FIG. 12 according to an embodiment. FIG. 14 is a plan view illustrating a protective member of FIG. 13.

For example, FIG. 13 is a schematic cross-sectional view illustrating a folding area FDA, a first non-folding area NFA1 and a second non-folding area NFA2 of a protective layer PL included in a display device 30 of FIG. 12 according to an embodiment, and FIG. 14 is a plan view illustrating a protective member 610 included in the protective layer PL of FIG. 12 according to an embodiment.

Hereinafter, descriptions overlapping those of the display device 10 described with reference to FIGS. 1 and 2 will be omitted or simplified.

Referring to FIGS. 12, 13 and 14, the protective layer PL included in the display device 30 may include the protective member 610, a first metal layer 620 and an adhesive member 630. The protective member 610, the first metal layer 620 and the adhesive member 630 may be disposed in an entire area of the folding area FDA, the first non-folding area NFA1 and the second non-folding area NFA2.

In an embodiment, the protective member 610 may include a material including multiple pores PR. For example, the protective member 610 may include a polymer including the pores PR.

In an embodiment, the protective member 610 may have a lattice structure LTC. The lattice structure LTC of the protective member 610 may be formed through a photolithography process.

Although FIG. 14 illustrates that the protective member 610 has the lattice structure LTC defining repeated openings of rectangular planar shape in a plan view, the disclosure is not limited thereto. In another embodiment, the protective member 610 may have the lattice structure LTC defining repeated openings of various shapes, may have the lattice structure LTC defining repeated recesses of various shapes, or may not have the lattice structure LTC.

The first metal layer 620 may be disposed on the protective member 610. The first metal layer 620 may include a metal. For example, the first metal layer 620 may include stainless steel.

The adhesive member 630 may be disposed between the protective member 610 and the first metal layer 620. The adhesive member 630 may couple the protective member 610 and the first metal layer 620. In an embodiment, the adhesive member 630 may be a pressure sensitive adhesive layer (PSA).

Figure 15:
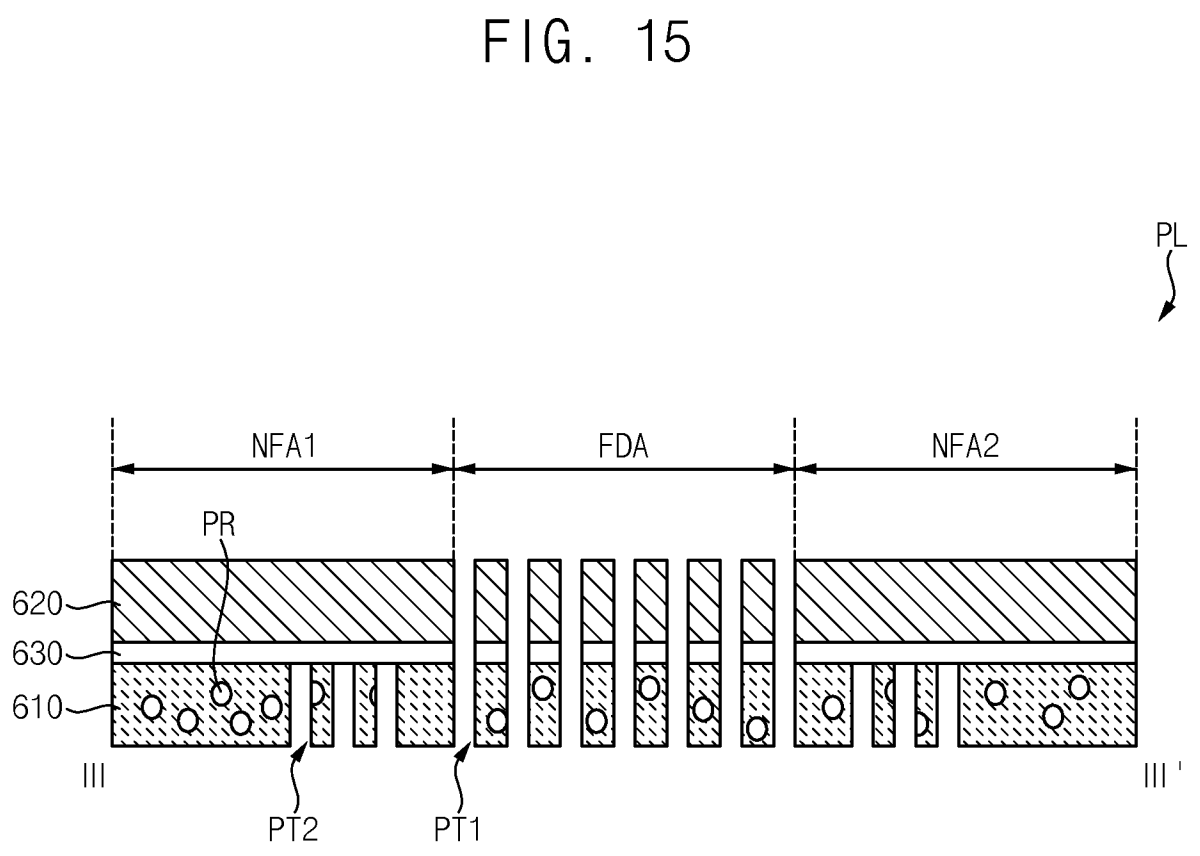

FIG. 15 is a schematic cross-sectional view taken along line III-III' of FIG. 12 according to an embodiment.

Referring to FIG. 15, the protective layer PL may include the protective member 610, the first metal layer 620 and the adhesive member 630.

Hereinafter, descriptions overlapping with those of the protective layer PL described with reference to FIGS. 13 and 14 will be omitted or simplified.

The adhesive member 630 and the first metal layer 620 may be sequentially disposed on the protective member 610.

In an embodiment, the protective layer PL may include multiple first patterns PT1 overlapping the folding area FDA and penetrating the protective layer PL in the thickness direction.

The protective layer PL may include multiple second patterns PT2 overlapping the first and second non-folding areas NFA1 and NFA2 adjacent to the first patterns PT1 in the thickness direction. In an embodiment, the second patterns PT2 may be patterns recessed from the lower surface of the protective layer PL spaced apart from the display panel toward the upper surface of the protective layer PL adjacent to the display panel. For example, the second patterns PT2 may be recessed patterns from a lower surface of the protective member 610 toward the first metal layer 620.

Figure 16:
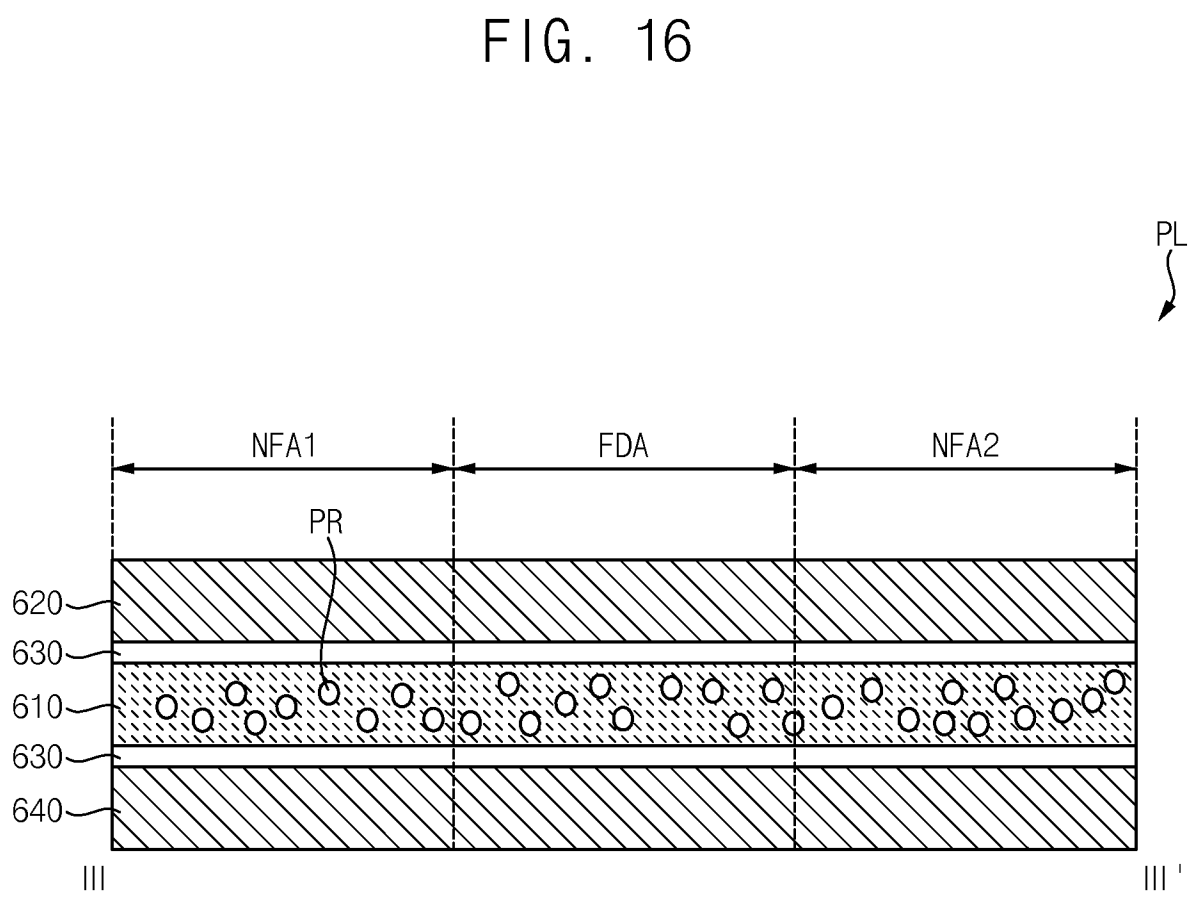

FIG. 16 is a schematic cross-sectional view taken along line III-III' of FIG. 12 according to an embodiment.

Referring to FIG. 16, the protective layer PL may include the protective member 610, the first metal layer 620, the adhesive members 630 and a second metal layer 640.

Hereinafter, descriptions overlapping with those of the protective layer PL described with reference to FIGS. 13 and 14 will be omitted or simplified.

The second metal layer 640 may be disposed below the protective member 610. The second metal layer 640 and the first metal layer 620 may include a same material. For example, the second metal layer 640 may include stainless steel.

The adhesive member 630 may be further disposed between the second metal layer 640 and the protective member 610. For example, the adhesive members 630 may be disposed between the second metal layer 640 and the protective member 610 and between the protective member 610 and the first metal layer 620. Each of the adhesive members 630 may couple the second metal layer 640 and the protective member 610, and may couple the protective member 610 and the first metal layer 620.

Figure 17:
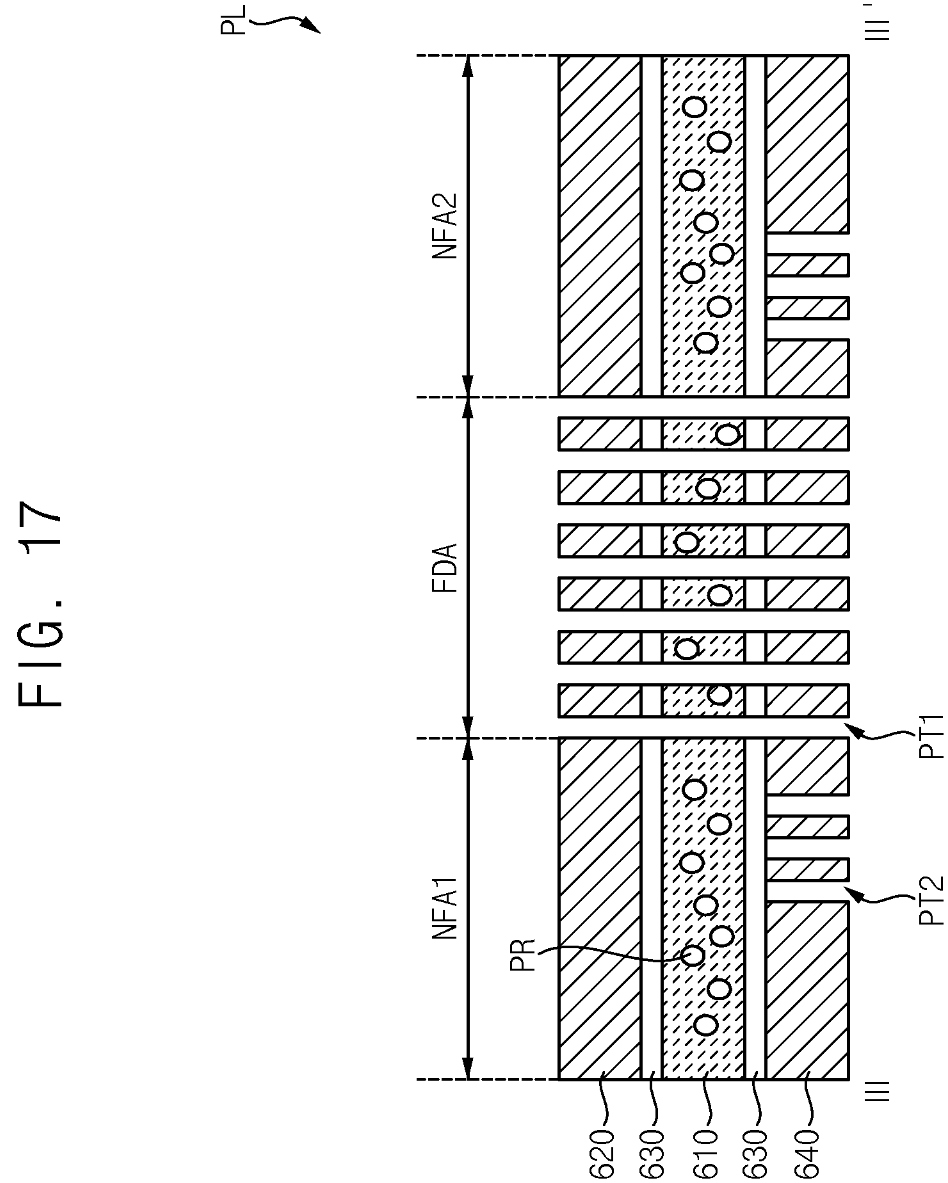
FIG. 17 is a schematic cross-sectional view taken along line III-III' of FIG. 12 according to an embodiment.

FIG. 17 is a schematic cross-sectional view taken along line III-III' of FIG. 12 according to an embodiment.

Referring to FIG. 17, the protective layer PL may include the protective member 610, the first metal layer 620, the adhesive members 630 and the second metal layer 640.

Hereinafter, descriptions overlapping with those of the protective layer PL described with reference to FIG. 16 will be omitted or simplified.

The protective member 610 and the first metal layer 620 may be sequentially disposed on the second metal layer 640, and the adhesive members 630 may be disposed between the second metal layer 640 and the protective member 610 and between the protective member 610 and the first metal layer 620.

In an embodiment, the protective layer PL may include multiple first patterns PT1 overlapping the folding area FDA and penetrating the protective layer PL in the thickness direction.

The protective layer PL may include multiple second patterns PT2 overlapping the first and second non-folding areas NFA1 and NFA2 adjacent to the first patterns PT1 in the thickness direction. In an embodiment, the second patterns PT2 may be patterns recessed from the lower surface of the protective layer PL spaced apart from the display panel toward the upper surface of the protective layer PL adjacent to the display panel. For example, the second patterns PT2 may be recessed patterns from a lower surface of the second metal layer 640 toward the first metal layer 620.

The display device 30 according to an embodiment of the disclosure may include the protective layer PL including the protective member 610, the first metal layer 620 and the adhesive member 630. As the protective member 610 includes the polymer including the pores PR, impact force applied to the display panel may be reduced. Accordingly, bright spot defects caused by a material having high rigidity of the display panel may be improved. Since the protective layer PL includes the first patterns PT1 overlapping the folding area FDA and penetrating the protective layer PL and the second patterns PT2 overlapping the first and second non-folding areas NFA1 and NFA2 and recessed from the lower surface of the protective layer PL, impact resistance and strain rate of the display device 30 may be improved.

The disclosure can be applied to various display devices. For example, the disclosure is applicable to various display devices such as display devices for vehicles, ships, aircraft, portable communication devices, display devices for exhibition or information transmission, medical display devices, and the like.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a display panel including a first non-folding area, a second non-folding area spaced apart from the first non-folding area, and a folding area disposed between the first non-folding area and the second non-folding area;

a first support member disposed below the display panel in the first non-folding area and having a hemming structure at an end adjacent to the folding area;

a second support member disposed below the display panel in the second non-folding area, having a hemming structure at an end adjacent to the folding area, and spaced apart from the first support member in the folding area; and a metal member disposed between the first support member and the second support member and including a metal and a plurality of pores, wherein at least one of the first support member and the second support member comprises at least one metal layer comprising a plurality of pores filled with a filling member.

2. The display device of claim 1, further comprising:

an adhesive member disposed below the metal member, wherein the adhesive member contacts the first support member and the second support member.

3. The display device of claim 1, wherein each of the first support member and the second support member includes a first metal layer and a second metal layer disposed on the first metal layer.

4. The display device of claim 3, wherein the first metal layer and the metal member include a same material.

5. The display device of claim 3, wherein each of the first support member and the second support member further includes a third metal layer disposed on the second metal layer, and each of the second metal layers and the metal member include a same material.

6. The display device of claim 3, wherein the at least one metal layer comprising the plurality of pores filled with the filling member is at least one of the second metal layers.

7. The display device of claim 6, wherein the filling member coats an upper surface of the second metal layer.

8. The display device of claim 1, wherein the metal member includes aluminum.

* * * * *